(12) United States Patent
Hasegawa (10) Patent No.: US 7,436,077 B2
(45) Date of Patent: Oct. 14, 2008

(54) SEMICONDUCTOR DEVICE AND METHOD OF MANUFACTURING THE SAME

(75) Inventor: Kiyoshi Hasegawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1079 days.

(21) Appl. No.: 10/284,105

(22) Filed: Oct. 31, 2002

(65) Prior Publication Data

US 2003/0197291 A1 Oct. 23, 2003

(30) Foreign Application Priority Data

Apr. 19, 2002 (JP) ............................. 2002-117317

(51) Int. Cl.
*H01L 23/544* (2006.01)

(52) U.S. Cl. .................. 257/797; 257/432; 257/431; 257/730; 257/676; 257/712; 257/729; 257/786; 257/711; 257/98; 257/E23.179; 257/E21.522; 438/401

(58) Field of Classification Search .............. 257/797, 257/98, 432, 431, 730, 676, 712, 786, 711, 257/729, E21.522; 438/401
See application file for complete search history.

(56) References Cited

U.S. PATENT DOCUMENTS

| | | | | |
|---|---|---|---|---|
| 5,644,102 | A * | 7/1997 | Rostoker | 174/52.1 |
| 6,278,193 | B1 * | 8/2001 | Coico et al. | 257/797 |
| 6,441,504 | B1 * | 8/2002 | Glenn et al. | 257/797 |
| 6,476,499 | B1 * | 11/2002 | Hikita et al. | 257/777 |
| 6,518,090 | B2 * | 2/2003 | Dotta et al. | 438/106 |
| 6,531,370 | B2 * | 3/2003 | Sakamoto et al. | 438/343 |
| 6,555,925 | B1 * | 4/2003 | Higashi et al. | 257/797 |
| 6,571,466 | B1 * | 6/2003 | Glenn et al. | 29/841 |
| 6,646,325 | B2 * | 11/2003 | Yamaguchi | 257/622 |

FOREIGN PATENT DOCUMENTS

| | | |
|---|---|---|
| JP | 2001015994 | 1/2001 |
| JP | 2001044304 | 2/2001 |
| JP | 2001196403 | 7/2001 |
| JP | 2001196489 | 7/2001 |

* cited by examiner

*Primary Examiner*—Lynne Gurley
*Assistant Examiner*—Junghwa Im
(74) *Attorney, Agent, or Firm*—Rabin & Berdo, PC (57) ABSTRACT

A semiconductor device includes a first surface faced to a mounting board when the semiconductor device is placed over the mounting board and a second surface opposed to the first surface. The semiconductor device also includes a position reference portion which is provided in an area including sides of the second surface and which has an optical reflection factor different from that of the mounting board.

20 Claims, 9 Drawing Sheets

Prior Art

Fig.16

Prior Art

US 7,436,077 B2

SEMICONDUCTOR DEVICE AND METHOD OF MANUFACTURING THE SAME

BACKGROUND OF THE INVENTION

1. Field of the Invention

The present invention relates to a semiconductor device having a package structure, a method of manufacturing the same and a method of measuring a position of the semiconductor device, and particularly to a semiconductor device capable of enhancing the accuracy of measurement of a position of the semiconductor device, which is executed after the surface of an sealing resin (mold) for the semiconductor device is placed over a mounting board with being opposed thereto, a manufacturing method thereof and a method of measuring the position of the semiconductor device.

This application is counterpart of Japanese patent applications, Serial Number 117317/2002, filed Apr. 19, 2002, the subject matter of which is incorporated herein by reference.

2. Description of the Related Art

For example, Japanese Laid-Open Patent No. 2001-196403 has disclosed a semiconductor device having a WCSP (abbreviation for Wafer Level Chip Size Package or Wafer Level Chip Scale Package) structure which allows electrode terminals to protrude above an sealing resin for the semiconductor device. Since a WCSP technology performs packaging in a state of a semiconductor wafer formed with circuit patterns as it is, each of semiconductor chips (pieces) separated by dicing results in a semiconductor device. A package size substantially identical to a chip size can be realized.

Figure 15:
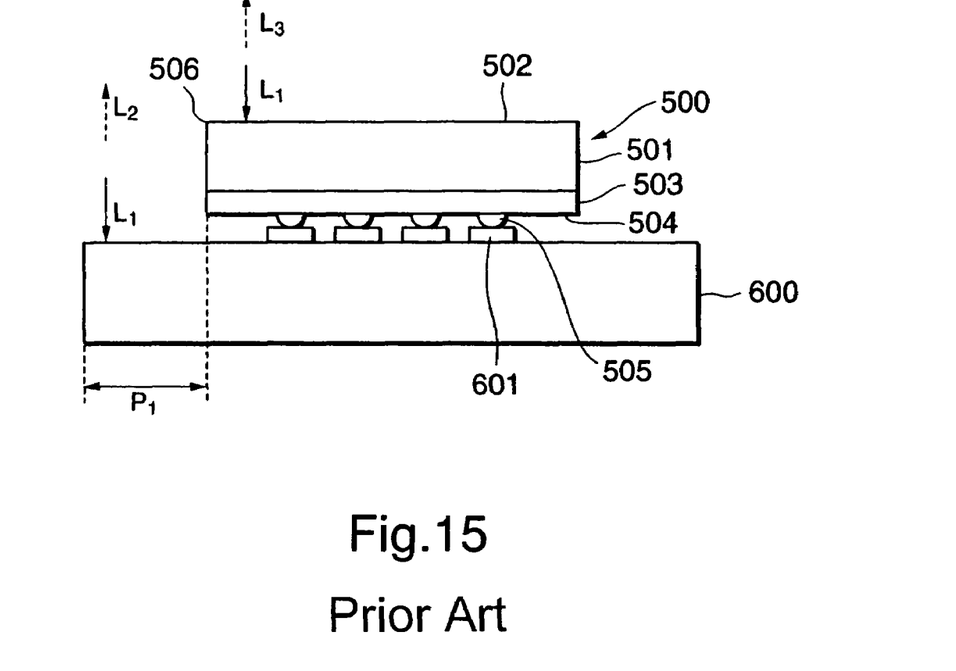
FIG. 15 is a side view schematically illustrating the state of mounting of a conventional semiconductor device to a suitable position of a mounting board.
Figure 16:
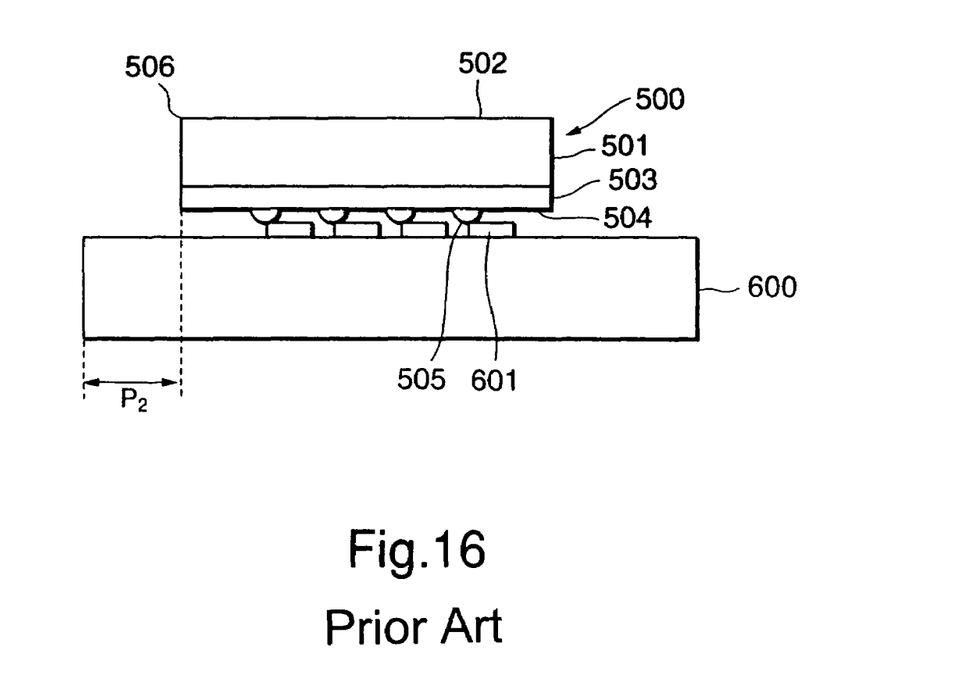
FIG. 16 is a side view schematically depicting the state of mounting of the conventional semiconductor device to an unsuitable position of the mounting board.

As shown in FIG. 15, a semiconductor device 500 having a WCSP structure is placed over a mounting board 600 with a back 502 of a semiconductor substrate 501 being turned up and a surface 504 of an sealing resin 503 and electrode terminals 505 being opposed to the mounting board 600. Thereafter, an opto-mechanical process is performed in which the intensity of light $L_2$ or $L_3$ returned when laser light $L_1$ is applied to a semiconductor device 500 or a mounting board 600 is measured. A position where a change in the intensity of the returned light $L_2$ or $L_3$ is detected, is regarded as an end (outer peripheral position or contour) 506 of the semiconductor device 500, and a position to mount the semiconductor device 500 is measured. If a distance (e.g., measured value $P_1$ in FIG. 15) from a reference point falls within a defined range, it can be then judged that the electrode terminals 505 of the semiconductor device 500 have suitably been connected to their corresponding electrode terminals 601 of the mounting board 600 as shown in FIG. 15. If a distance (e.g., measured value $P_2$ in FIG. 16) from the reference point falls outside the defined range, it can be then judged that the electrode terminals 505 of the semiconductor device 500 have not suitably been connected to their corresponding electrode terminals 601 of the mounting board 600 as shown in FIG. 16 by way of example.

In the above-described conventional semiconductor device 500, however, the back 502 of the silicon substrate 501 is finished to a mirror surface by a grinding process to thin the thickness of the silicon substrate 501. Hence the difference between the intensity of the returned light $L_3$ reflected by the back 502 of the semiconductor device 500 and the intensity of the returned light $L_2$ reflected by the mounting board 600 is small. Therefore, a problem arises in that the frequency of making it unable to detect the end 506 of the semiconductor device 500 or misjudging each point other than the end 506 as an end increases and the accuracy of a position measurement in a process of inspecting a mounted state of each semiconductor device at its manufacturing stage is reduced.

SUMMARY OF THE INVENTION

According to one aspect of the present invention, there is provided a semiconductor device that includes a first surface faced to a mounting board when the semiconductor device is placed over the mounting board and a second surface opposed to the first surface. The semiconductor device also includes a position reference portion which is provided in an area including sides of the second surface and which has an optical reflection factor different from that of the mounting board.

Further, a method according to another invention is a method of manufacturing pieces of semiconductor devices each placed over a mounting board from a semiconductor wafer formed with a plurality of circuit patterns, the method including: placing a first surface opposite to the mounting board on a dicing tape when the semiconductor device is placed over the mounting board; dicing the semiconductor wafer from a second surface opposite to the first surface; forming a position reference portion having an optical reflection factor different from that of the mounting board, the position reference portion being adjacent to grooves defined by the dicing and extend in directions along the grooves; and separating the pieces of semiconductor devices from the semiconductor wafer.

Furthermore, a method of semiconductor device according to a further invention is a method of manufacturing pieces of semiconductor devices each placed over a mounting board from a semiconductor wafer formed with a plurality of circuit patterns, the method including: separating the pieces of semiconductor devices each placed over the mounting board from the semiconductor wafer; and forming a position reference portion having an optical reflection factor different from that of the mounting board and being provided in an area, the area including sides of a second surface which is the opposite side of a first surface opposed to the mounting board when the semiconductor device is placed over the mounting board.

The optical reflection factor of the position reference portion may be set smaller than both the optical reflection factor of the mounting board and the optical reflection factor of the second surface. Further, the position reference portion can be formed as an ink application portion.

The area in which the position reference portion is provided, can be formed so as to include at least one of four sides of the second surface and extend in a direction along the one side. The area in which the position reference portion is provided, may be formed so as to include all of the four sides of the second surface and extend in directions along the respective four sides. The areas in which the position reference portions are provided, may be provided so as to include the opposed two sides of the second surface and extend in directions along the respective two sides.

The area in which the position reference portion is provided, can be formed so as to be provided at least one of four corners of the second surface. The area in which the position reference portion is provided, may be provided at each of the four corners of the second surface.

The first surface may be provided as a surface of the sealing resin that constitutes the semiconductor device, and the second surface may be provided as a back of the semiconductor substrate that constitutes the semiconductor device. Electrode terminals may be provided which protrude from the first surface and are electrically connected to electrode terminals of the mounting board respectively. The second surface may be formed as a mirror surface.

Further, a method of measuring a position of a semiconductor device, according to the present invention is a method of measuring a position of a semiconductor device in electronic equipment equipped with the semiconductor device, comprising: effecting a step for applying laser light to the electronic equipment and detecting returned light, on a plurality of points of the electronic equipment; and detecting a point in which a change in the intensity of the returned light is greater than or equal to a defined value and determining an end position at which the position reference portion of the semiconductor substrate is provided, based on the detected point.

DETAILED DESCRIPTION OF THE PREFERRED EMBODIMENTS

A semiconductor device according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Structure of Semiconductor Device

Figure 1:
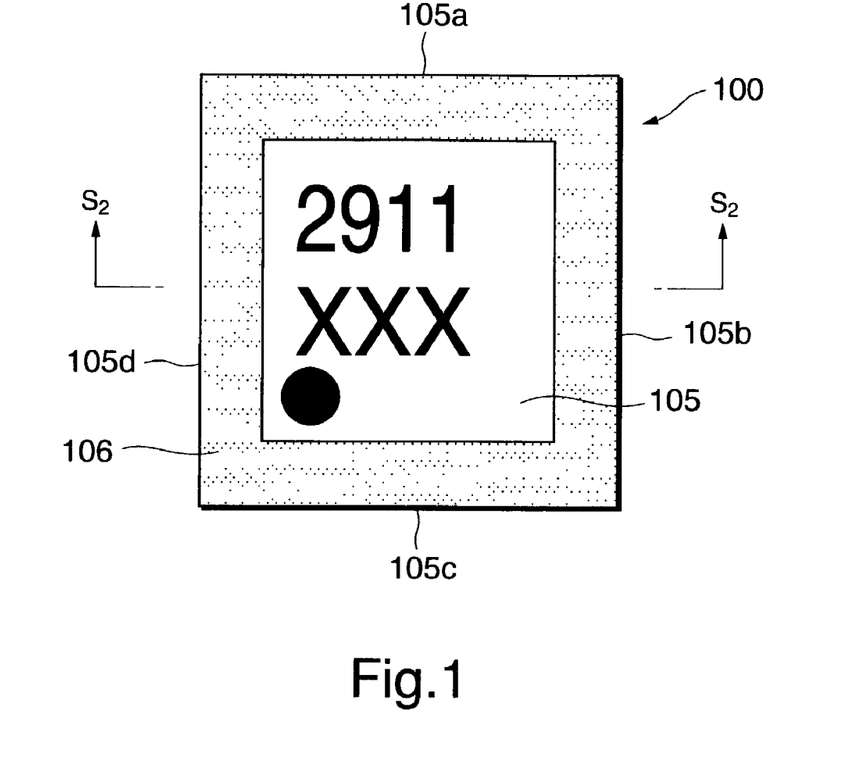
FIG. 1 is a plan view schematically showing the back of a semiconductor device according to a first embodiment of the present invention.
Figure 2:
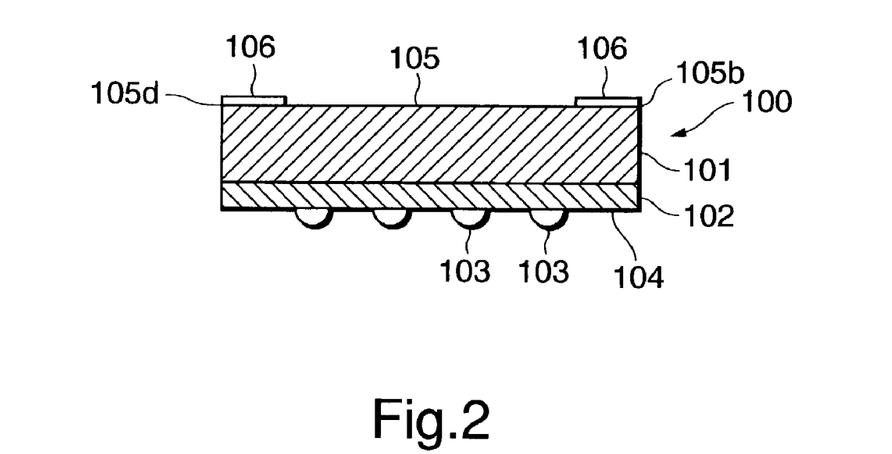
FIG. 2 is a cross-sectional view schematically illustrating a surface obtained by cutting FIG. 1 with line $S_2$-$S_2$.
Figure 3:
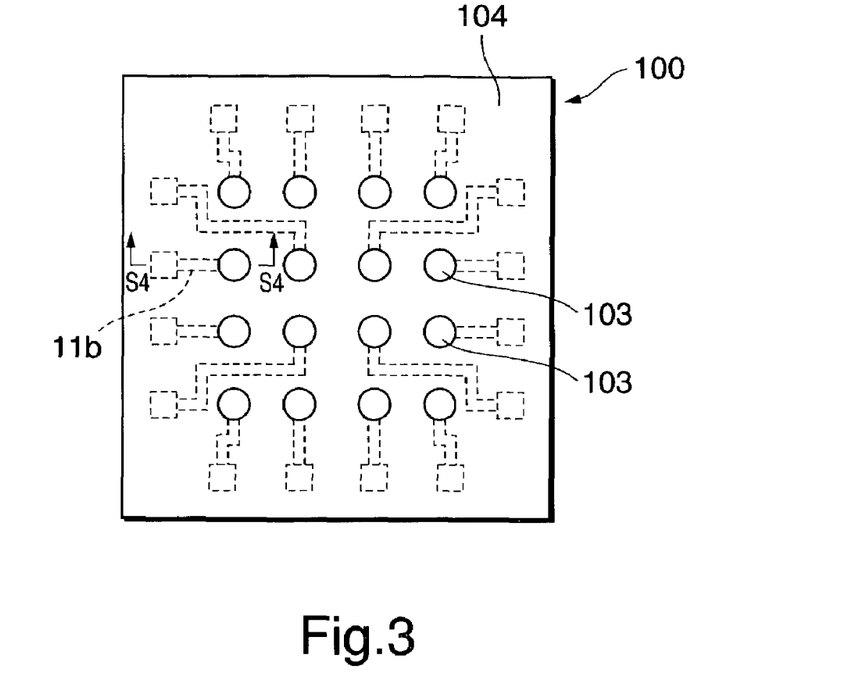
FIG. 3 is a plan view schematically showing the surface of the semiconductor device according to the first embodiment.
Figure 4:
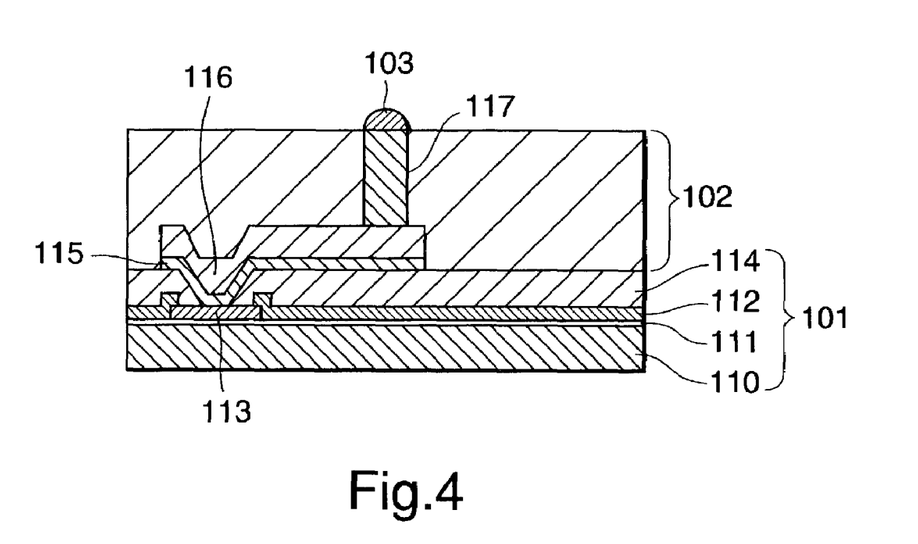
FIG. 4 is a cross-sectional view schematically illustrating a surface obtained by cutting FIG. 3 with line $S_4$-$S_4$.
Figure 5:
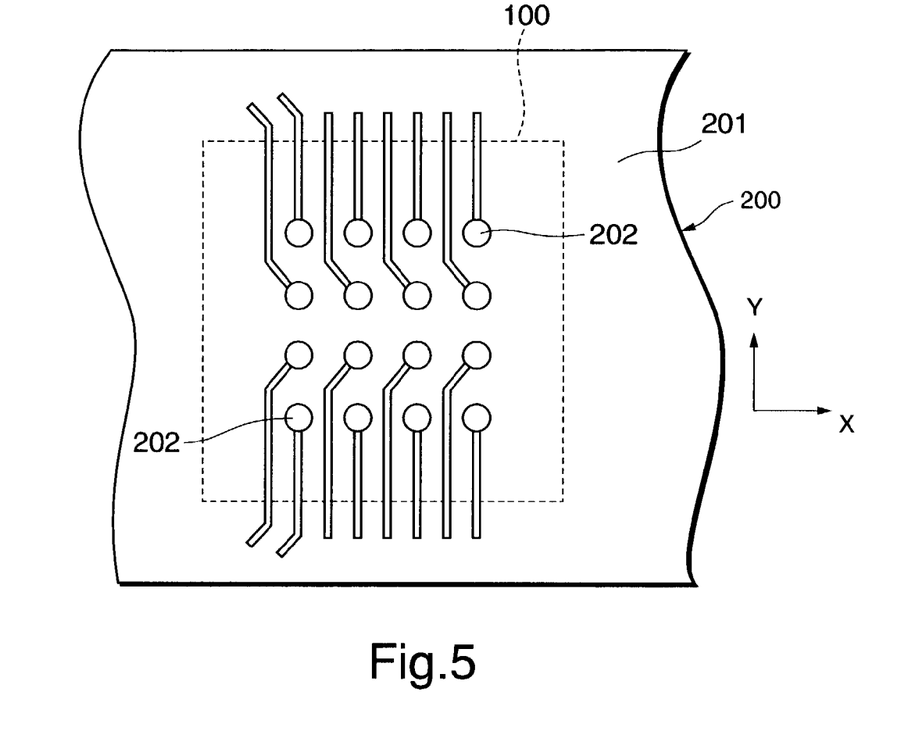
FIG. 5 is a plan view schematically depicting a mounting board equipped with the semiconductor device according to the first embodiment.
Figure 6:
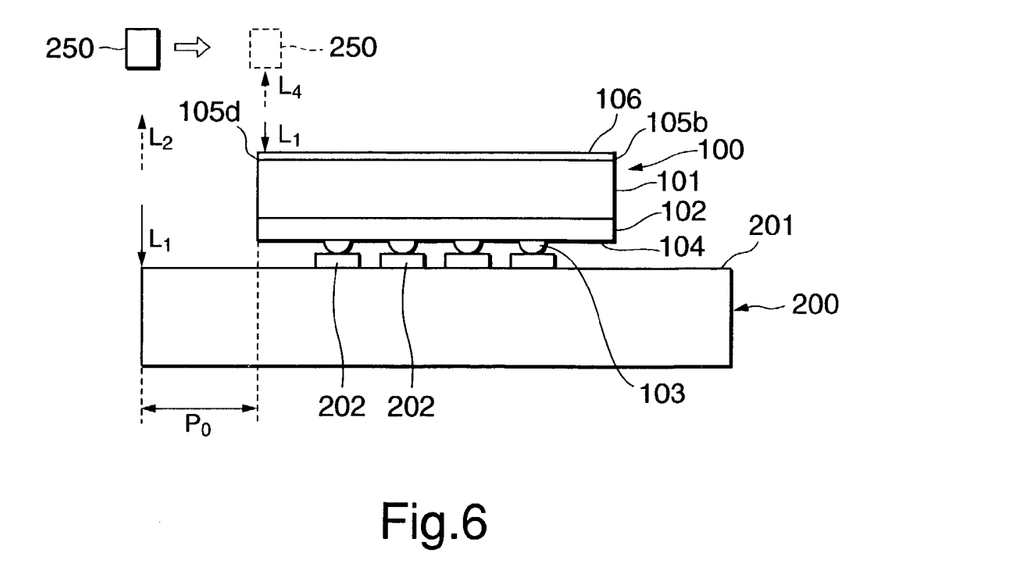
FIG. 6 is a side view schematically illustrating the state of mounting of the semiconductor device according to the first embodiment to the mounting board.

FIG. 1 is a plan view schematically showing the back of a semiconductor device 100 according to a first embodiment of the present invention, and FIG. 2 is a cross-sectional view schematically illustrating a surface thereof obtained by cutting FIG. 1 with line $S_2$-$S_2$, respectively. FIG. 3 is a plan view schematically showing the surface of the semiconductor device 100 according to the first embodiment, and FIG. 4 is a cross-sectional view schematically illustrating a surface thereof obtained by cutting FIG. 3 with line $S_4$-$S_4$, respectively. FIG. 5 is a plan view schematically showing a mounting board 200 equipped with the semiconductor device 100 according to the first embodiment, and FIG. 6 is a side view schematically illustrating the state of mounting of the semiconductor device 100 over the mounting board 200, respectively.

The semiconductor device 100 according to the first embodiment has a WCSP structure, for example. However, the present invention can be applied even to a semiconductor device other than one having the WCSP structure and is applicable to all the semiconductor devices each mounted over the mounting board 200 so that a semiconductor substrate 101 of each semiconductor device 100 is directed outwardly (i.e., it is directed to the opposite side of the mounting board 200). Further, the semiconductor device 100 according to the first embodiment is shaped in the form of a quadrangle whose one side is a few mm, for example. However, the size and shape of the semiconductor device 100 are not limited to them.

As shown in FIGS. 1 through 4, the semiconductor device 100 according to the first embodiment includes a semiconductor substrate 101 formed with circuit patterns (circuit elements), a sealing resin (mold) 102 for covering the top of the semiconductor substrate 101, and a plurality of electrode terminals 103 which protrude outside the sealing resin 102. As shown in FIG. 4, the semiconductor substrate 101 has a silicon substrate 110, an insulating layer 111, a passivation film 112, an electrode pad 113, an interlayer insulating film 114, a metal thin film layer 115, a metal wiring layer 116 and a post 117. The sealing resin 102 has the function of protecting the circuit patterns on the semiconductor substrate 101 from an external environment. Further, each of the electrode terminals 103 is formed on a respective post 117 used as a conductive wiring formed inside the sealing resin 102, and is electrically connected to its corresponding circuit element (not shown) formed in the silicon substrate 110 through the post 117, the metal wiring layer 116, the metal thin film layer 115 and the electrode pad 113. The electrode terminal 103 functions as an external terminal of the semiconductor device 100. The sealing resin 102 has a surface (surface as placed downward in FIG. 2) 104 opposite to the mounting board 200 when it is mounted over the mounting board 200 as shown in FIG. 5. Incidentally, the present invention is not limited to the form, thickness and material of the sealing resin 102 and the number and shapes of the electrode terminals 103. Further, the present invention is not limited even to the structure of the semiconductor substrate 101.

Further, as shown in FIGS. 1 and 2, the semiconductor device 100 according to the first embodiment also has a reverse side or back 105 (surface as placed upward in FIG. 2) of the semiconductor substrate 101, which corresponds to a surface located on the opposite side of the surface 104 of the sealing resin 102. The back 105 normally corresponds to a mirror surface formed by subjecting the silicon substrate to a grinding processing.

Furthermore, as shown in FIG. 1, the semiconductor device 100 according to the first embodiment has a coloring portion 106 used as a position reference portion, which is placed on the back 105, includes all of four sides 105a, 105b, 105c and 105d of the back 105 and extends in directions along the respective sides 105a, 105b, 105c and 105d. The coloring portion 106 has an optical reflection factor different from that of a surface 201 of the mounting board 200. The coloring portion 106 is an ink application portion (e.g., black ink portion) having an optical reflection factor smaller than that of the surface 201 of the mounting board 200, for example. Incidentally, the shape of the coloring portion 106 is not limited to one referred to above or one illustrated in the drawing. An area in which the coloring portion 106 is provided, may be one including at least one side (i.e., end position of the semiconductor device 100, which is to be measured upon the measurement of its position by laser light) of the four sides 105a, 105b, 105c and 105d of the back 105, or some thereof. Incidentally, all of the substances and structures each having an optical reflection factor different from that of the surface 201 of the mounting board 200 are included in the position reference portion. Thus, the position reference portion includes not only the substances provided on the mounting board 200 as in the coloring portion 106 but also a structure (e.g., surface structure having an optical reflection factor different from that in a central area of the mounting board 200 as in a rough-surface structure or the like).

As shown in FIGS. 5 and 6, the mounting board 200 is provided with a plurality of electrode terminals 202 located on its surface 201. When the semiconductor device 100 is placed over the mounting board 200, the semiconductor device 100 is placed and fixed in such a manner that the electrode terminals 202 of the mounting board 200 and the electrode terminals 103 of the semiconductor device 100 are suitably superimposed on one another as shown in FIG. 6. Incidentally, a quadrangle indicated by a broken line in FIG. 5 shows a position where the semiconductor device 100 is to be mounted. The mounting board 200 equipped with the semiconductor device 100 thereon is built in various pieces of electronic equipment, particularly small-sized portable devices.

Position Measurement of Semiconductor Device

After the mounting of the semiconductor device 100 over the mounting board 200, the position of the semiconductor device 100 is measured. This position measurement makes use of a laser position measuring device 250 for applying laser light to the semiconductor device and detecting its reflected light (returned light). The laser position measuring device 250 moves in X-axis and Y-axis directions shown in FIG. 5 over the mounting board 200 equipped with the semiconductor device 100. A shown in FIG. 6, the laser position measuring device 250 measures the intensity of light $L_2$ or $L_4$ returned when laser light $L_1$ is applied to the semiconductor device 100 or the mounting board 200. Further, the laser position measuring device 250 regards a position where a change in the intensity greater than or equal to a reference value, of the returned light $L_2$ or $L_4$ is detected, as an end (e.g., 105d) of the semiconductor device 100 and measures a position to mount the semiconductor device 100. It can be judged that if a substrate measured value $P_0$ corresponding to a distance from a reference position (e.g., the end) of the mounting board 200 to the end of the semiconductor device 100 falls within a defined range, then the electrode terminals 103 of the semiconductor device 100 are suitably connected to their corresponding electrode terminals 202 of the mounting board 200 as shown in FIG. 6. It can be judged that if the measured value P0 falls outside the defined range, then the electrode terminals 103 of the semiconductor device 100 are not suitably connected to their corresponding electrode terminals 202 of the mounting board 200. In this case, there are produced defective conditions such as failures in the contact between the electrode terminals 103 of the semiconductor device 100 and the electrode terminals 202 of the mounting board 200, a reduction in the connection strength of the semiconductor device 100, the fixing of the semiconductor device 100 in an inclined posture, etc.

In the semiconductor device 100 according to the first embodiment, the coloring portion 106 having the optical reflection factor different from that of the surface 201 of the mounting board 200 is provided in the area including the respective sides 105a, 105b, 105c and 105d of the back 105 of the semiconductor substrate 101. Thus, the light $L_2$ returned from the mounting board 200 and the light $L_4$ returned from the coloring portion 106 are definitely different from each other in intensity. Therefore, the frequency of making it unable to detect the end of the semiconductor device 100 or misjudging a point other than the end as an end as in the case of the conventional semiconductor device provided with no coloring portion 106 can be extremely reduced, and the accuracy of a position measurement in a mounted-state inspecting process at a manufacturing stage can be enhanced.

Manufacturing Method of Semiconductor Device

Figure 7:
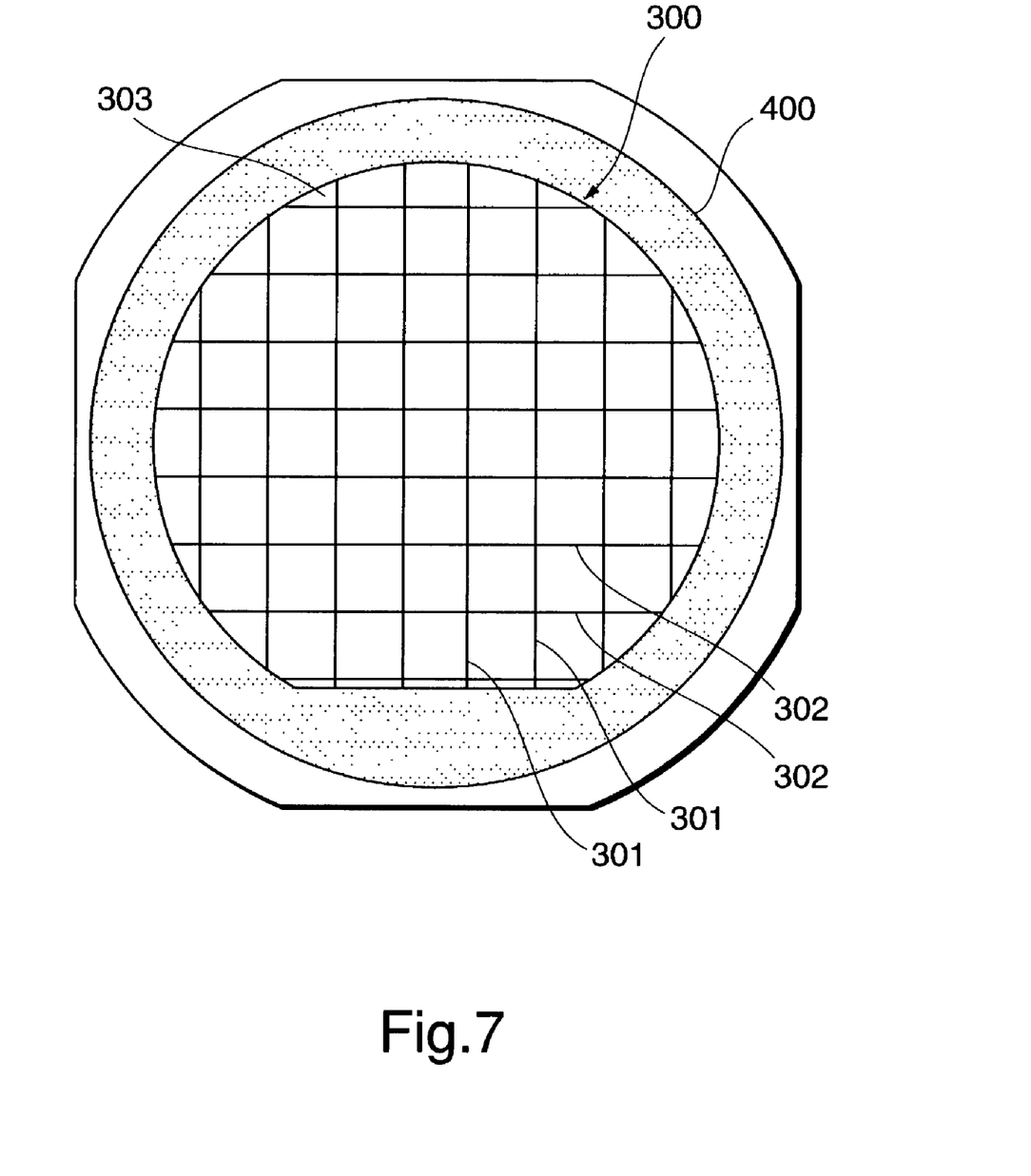
FIG. 7 is a plan view for describing a dicing process for a semiconductor wafer from which the semiconductor devices according to the first embodiment are separated.
Figure 8:
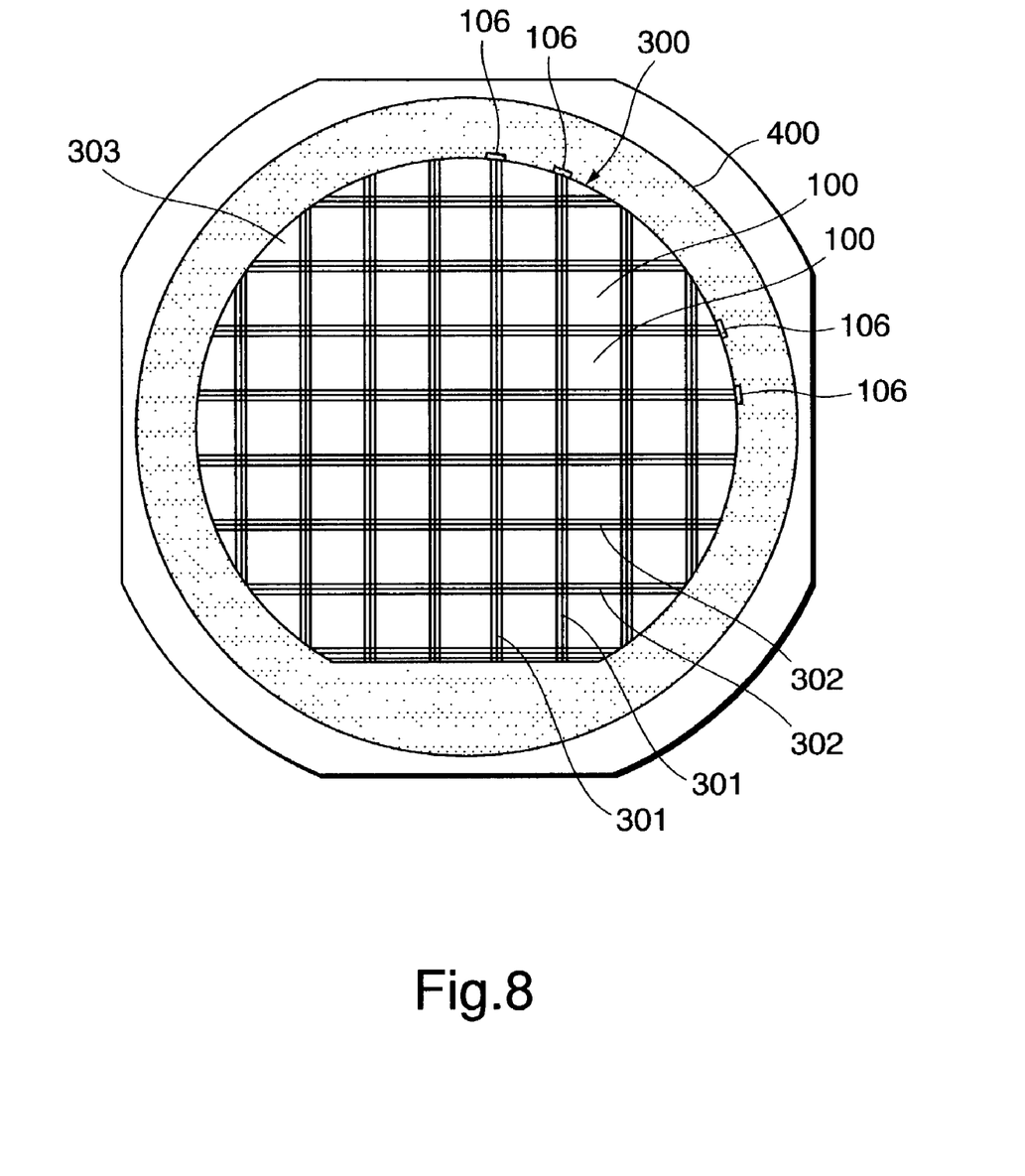
FIG. 8 is a plan view for describing an ink application process for the semiconductor wafer from which the semiconductor devices according to the first embodiment are separated.

FIG. 7 is a plan view for describing a dicing process of a semiconductor wafer 300 from which the semiconductor devices 100 according to the first embodiment are separated, and FIG. 8 is a plan view for describing an ink applying process of the semiconductor wafer 300 from which the semiconductor devices 100 according to the first embodiment are separated, respectively.

Upon the manufacture of the semiconductor device 100 according to the first embodiment, circuit patterns are first formed on the semiconductor wafer (silicon substrate) 300 and the surface of the semiconductor wafer 300 is molded with an sealing resin (portion corresponding to the sealing resin 102 of the semiconductor device 100 shown in FIG. 2). Next, the surface of the sealing resin is ground and cleaned. Then the electrical performance of a circuit for each semiconductor device formed on the semiconductor wafer is examined according to a probe test. Next, a back 303 of the semiconductor wafer 300 is polished to thin the thickness of the semiconductor wafer 300 (portion corresponding to the semiconductor substrate 101 of the semiconductor device 100 shown in FIG. 2), whereby the back 303 (portion corresponding to the back 105 of the semiconductor substrate 101 of the semiconductor device 100 shown in FIG. 2) is finished to a mirror surface.

Next, the surface (portion corresponding to the surface 104 of the semiconductor device 100 shown in FIG. 2) opposed to the mounting board 200 when each semiconductor device is placed over the mounting board 200, is placed on a dicing tape 400 as shown in FIG. 7 to fix the semiconductor wafer 300. Next, the semiconductor wafer 300 is diced from its back 303 while it remains in a state of being fixed to the dicing tape 400. This dicing is performed at equal intervals in vertical and horizontal directions. A plurality of groovees 301 and 302, which extend in the vertical and horizontal directions, are defined by dicing as shown in FIG. 7.

Next, as shown in FIG. 8, coloring portions 106 each having an optical reflection factor different from that of the mounting board 200 are formed in areas having predetermined widths, which are located on the back 303 of the semiconductor wafer 300 and include the groovees 301 and 302, and areas which extend in directions along the respective groovees 301 and 302. The coloring portions 106 are formed by applying ink through the use of an ink jet head. Incidentally, such characters, numerals an the like as shown in FIG. 1 may be printed onto the back 303 of the semiconductor wafer 300 before or after the formation of the coloring portions 106. While the printing of the characters and numerals is performed by a seal such as a rubber stamp, it may be carried out by use of the ink jet head.

Next, the process of eliminating adhesion of the dicing tape 400 is performed to separate individuals or pieces of the semiconductor devices 100 from the semiconductor wafer 300.

According to the method of manufacturing the semiconductor device according to the first embodiment as described above, the semiconductor device 100 equipped with the coloring portion 106 can be manufactured according to the method simplified and having the less number of process steps. Further, the frequency of occurrence of chipping of separated semiconductor devices can be reduced by carrying out ink application after the dicing process without being carried out before the dicing process.

Second Preferred Embodiment

Figure 9:
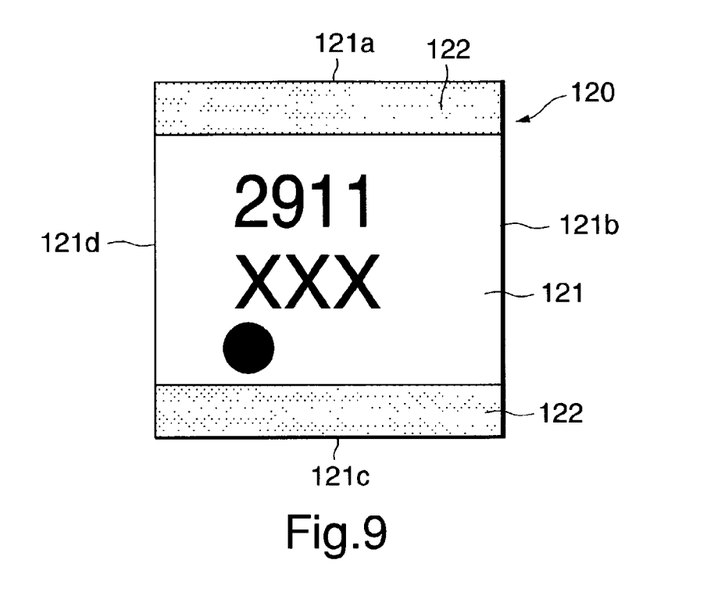
FIG. 9 is a plan view schematically showing the back of a semiconductor device according to a second embodiment of the present invention.
Figure 10:
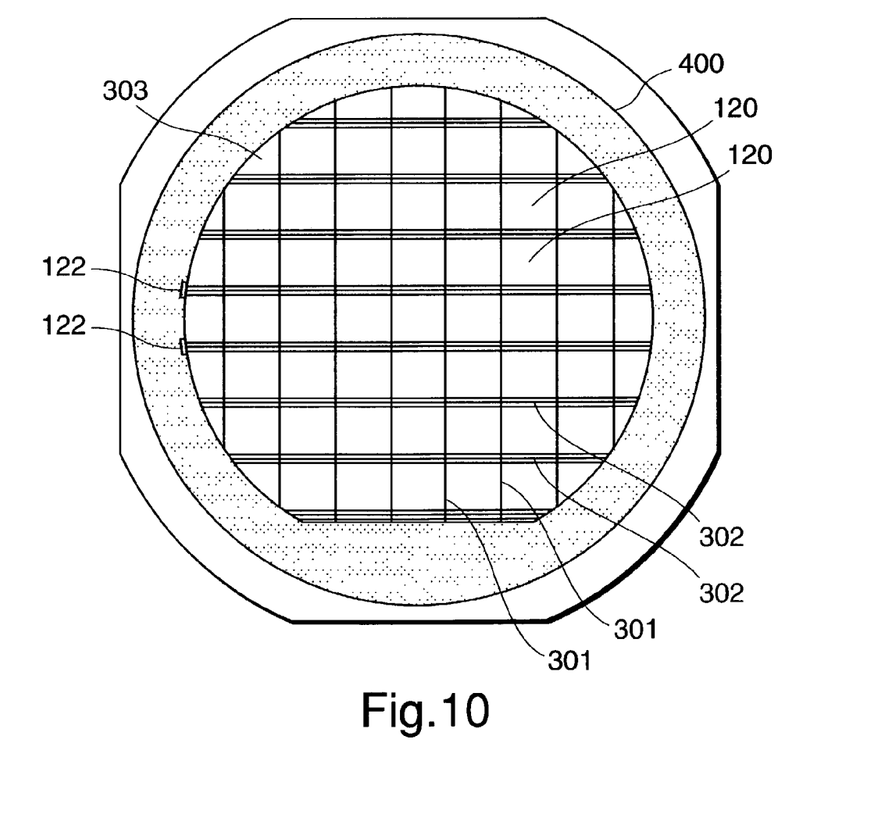
FIG. 10 is a plan view for describing an ink application process for a semiconductor wafer from which the semiconductor devices according to the second embodiment are separated.

FIG. 9 is a plan view schematically showing the back of a semiconductor device 120 according to a second embodiment of the present invention, and FIG. 10 is a plan view for describing an ink application process for a semiconductor wafer 300 from which the semiconductor devices 120 according to the second embodiment are separated, respectively. In the second embodiment, the shape of each coloring portion 122 used as a position reference portion differs from that of the coloring portion 106 employed in the first embodiment.

As shown in FIG. 9, the semiconductor device 120 according to the second embodiment has coloring portions 122, which are placed on a reverse side or back 121 and which include two sides 121a and 121c opposed to each other, of four sides 121a, 121b, 121c and 121d of the back 121 and extend in directions along the respective sides 121a and 121c. Each of the coloring portions 122 has an optical reflection factor different from a surface 201 of a mounting board 200.

In the ink application process of the semiconductor device 120 according to the second embodiment, as shown in FIG. 10, the coloring portions 122 each having an optical reflection factor different from that of the mounting board 200 are formed in areas located on a reverse side or back 303 (back 121 in FIG. 9) of the semiconductor wafer 300 and having predetermined widths, which include groovees 302, and areas which are located on the back 303 and extend in directions along the respective groovees 302. The coloring portions 122 are formed by applying ink through the use of an ink jet head.

Incidentally, the second embodiment is identical to the first embodiment except for the above.

Third Preferred Embodiment

Figure 11:
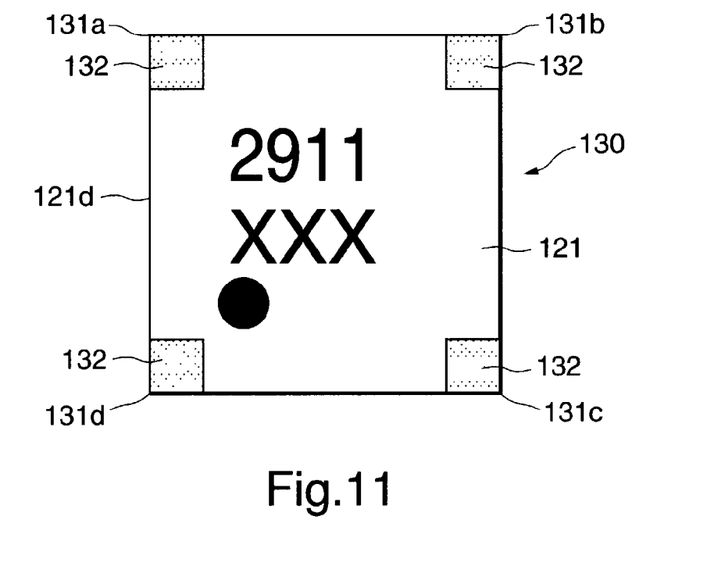
FIG. 11 is a plan view schematically showing the back of a semiconductor device according to a third embodiment of the present invention.
Figure 12:
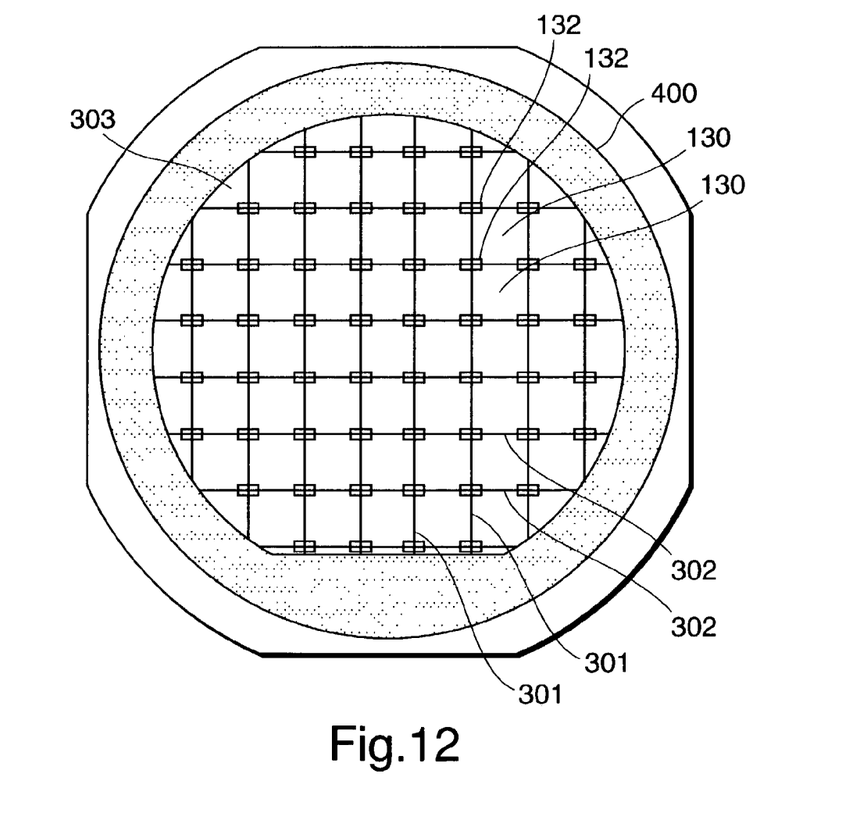
FIG. 12 is a plan view for describing an ink application process for a semiconductor wafer from which the semiconductor devices according to the third embodiment are separated.

FIG. 11 is a plan view schematically showing the back of a semiconductor device 130 according to a third embodiment of the present invention, and FIG. 12 is a plan view for describing an ink application process for a semiconductor wafer 300 from which the semiconductor devices 130 according to the third embodiment are separated, respectively. In the third embodiment, the shapes of coloring portions 132 used as position reference portions are different from the shape of the coloring portion 106 and the shapes of the coloring portions 122 of the second embodiment.

As shown in FIG. 11, the semiconductor device 130 according to the third embodiment has the coloring portions 132 formed in areas located on a reverse side or back 131 and including four corners 131a, 131b, 131c and 131d of the back 131. Each of the coloring portions 132 has an optical reflection factor different from that of a surface 201 of a mounting board 200.

In the ink application process of the semiconductor device 130 according to the third embodiment, as shown in FIG. 12, the coloring portions 132 each having the optical reflection factor different from that of the mounting board 200 are formed in areas having predetermined widths, which are located on the back 131 of the semiconductor wafer 300 and include intersecting portions of groovees 301 and 302. The coloring portions 132 are formed by applying ink through the use of an ink jet head.

Incidentally, the third embodiment is identical to the first or second embodiment except for the above.

Fourth Preferred Embodiment

Figure 13:
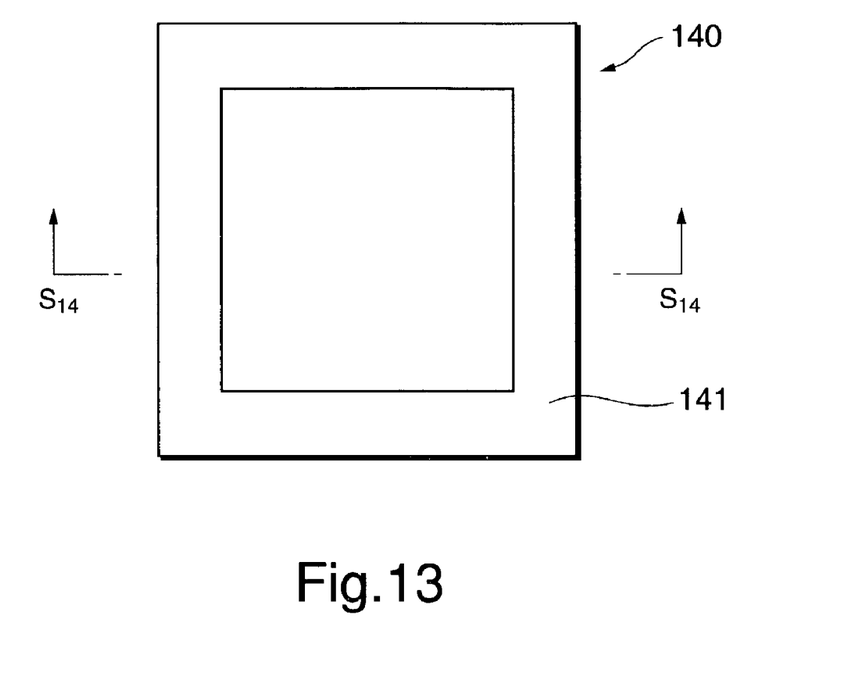
FIG. 13 is a front view of a rubber stamp for forming a coloring portion on the back of a semiconductor device according to a fourth embodiment of the present invention.
Figure 14:
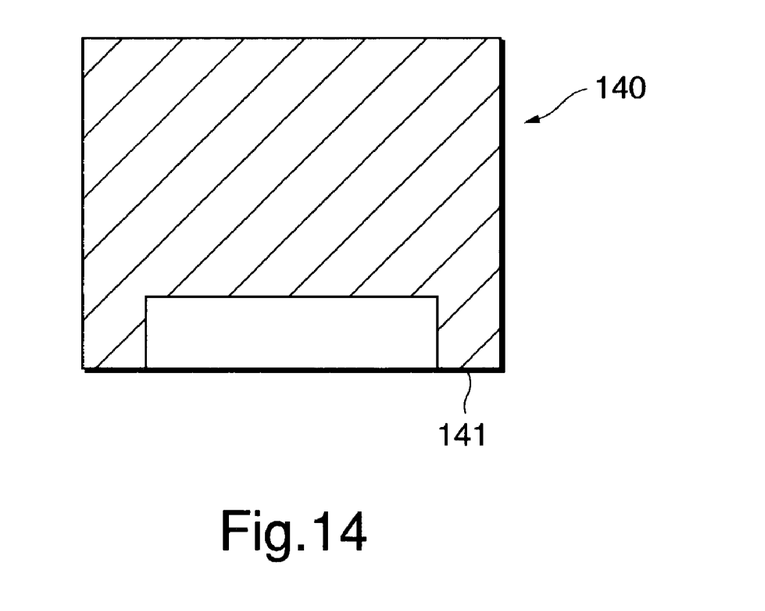
FIG. 14 is a cross-sectional view schematically showing a surface obtained by cutting FIG. 13 with line $S_{14}$-$S_{14}$.

FIG. 13 is a front view of a rubber stamp 140 for forming a coloring portion used as a position reference portion on the back of a semiconductor device according to a fourth embodiment of the present invention, and FIG. 14 is a cross-sectional view schematically showing a surface formed by cutting FIG. 13 with line $S_{14}$-$S_{14}$, respectively. The fourth embodiment is an example different in terms of the method of manufacturing the semiconductor device according to the first embodiment. Thus, the description of the fourth embodiment will be made with reference even to FIG. 1.

In a method of manufacturing the semiconductor device according to the fourth embodiment, individual semiconductor devices 100 each placed over a mounting board 200 are separated from a semiconductor wafer (see FIG. 7) formed with a plurality of circuit patterns. Thereafter, a coloring portion 106 is formed on the back of each semiconductor device 100. As shown in FIGS. 15 and 16, the formation of the coloring portion 106 is carried out by effecting a seal with a rubber stamp 140 having an ink holding surface 141 identical in size to each semiconductor chip separated from the semiconductor wafer. Further, the coloring portions 122 and 132 having the shapes shown in the second and third embodiments can also be formed by such a method.

Incidentally, the fourth embodiment is identical to the first to third embodiments except for the above.

According to the present invention as described above, an advantage can be obtained in that since the intensity of light returned from a mounting board and the intensity of light returned from a position reference portion are definitely different from each other in intensity upon a position measurement using laser light, the frequency of making it unable to detect the end of a semiconductor device or misjudging each point other than the end as an end can be extremely reduced and the accuracy of a position measurement in a process of inspecting a mounted state of each semiconductor device at its manufacturing stage can be enhanced.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device, comprising:
   a first surface facing a mounting board when the semiconductor device is placed over the mounting board;

a second surface opposed to the first surface; and a position reference portion which is provided at an outermost edge of the second surface, the position reference portion having an optical reflection factor different from an optical reflection factor of the mounting board so that the outermost edge of the second surface is opto-mechanically detectable, and opto-mechanically distinguishable from the mounting board.

2. The semiconductor device according to claim 1, wherein the optical reflection factor of the position reference portion is smaller than both the optical reflection factor of the mounting board and an optical reflection factor of the second surface.

3. The semiconductor device according to claim 1, wherein the position reference portion is an ink application portion.

4. The semiconductor device according to claim 1, wherein the outermost edge at which the position reference portion is provided, corresponds to an area which includes at least one of four sides of the second surface and extends in a direction along the one side.

5. The semiconductor device according to claim 1, wherein the outermost edge at which the position reference portion is provided, corresponds to an area which includes all of the four sides of the second surface and extends in directions along the respective four sides.

6. The semiconductor device according to claim 1, wherein the outermost edge at which the position reference portion is provided, corresponds to areas which include opposed two sides of the second surface and extend in directions along the respective two sides.

7. The semiconductor device according to claim 1, wherein the outermost edge at which the position reference portion is provided, is provided at at least one of the four corners of the second surface.

8. The semiconductor device according to claim 1, wherein the outermost edge at which the position reference portion is provided, is provided at each of four corners of the second surface.

9. The semiconductor device according to claim 1, further including a semiconductor substrate, and a sealing resin for covering the semiconductor substrate, wherein the first surface is a surface of the sealing resin and the second surface is a back of the semiconductor substrate.

10. The semiconductor device according to claim 1, further including electrode terminals which protrude from the first surface and are electrically connected to electrode terminals of the mounting board respectively.

11. The semiconductor device according to claim 1, wherein the second surface is a mirror surface.

12. A semiconductor device, comprising:

a semiconductor substrate having a first main surface formed with circuit elements and a second main surface substantially opposed to the first main surface; and a plurality of external terminals formed over the first main surface and electrically connected to the circuit elements, wherein the second main surface has a central area, and a peripheral area including an outermost edge of the second main surface, and wherein an optical reflection factor of the central area and an optical reflection factor of the peripheral area including the outermost edge, are different from each other, so that the outermost edge of the second main surface is opto-mechanically detectable.

13. A semiconductor device, comprising:

a semiconductor substrate having a first main surface formed with circuit elements and a second main surface substantially opposed to the first main surface; and a plurality of external terminals formed over the first main surface and electrically connected to the circuit elements, wherein the second main surface has a central area, and a peripheral area including an outermost edge of the second main surface, and wherein a position reference portion having an optical reflection factor different from an optical reflection factor of the central area is provided over the entire peripheral area, so that the outermost edge of the second main surface is opto-mechanically detectable.

14. The semiconductor device according to claim 12, wherein the peripheral area includes an ink application portion.

15. The semiconductor device according to claim 12, wherein the peripheral area corresponds to an area which includes at least one of four sides of the second main surface and extends in a direction along the one side.

16. The semiconductor device according to claim 12, wherein the peripheral area corresponds to an area which includes all of the four sides of the second main surface and extends in directions along the respective four sides.

17. The semiconductor device according to claim 12, wherein the peripheral area corresponds to areas which include opposed two sides of the second main surface and extend in directions along the respective two sides.

18. The semiconductor device according to claim 12, wherein the peripheral area is provided at at least one of the four corners of the second surface.

19. The semiconductor device according to claim 13, wherein the position reference portion is an ink application portion.

20. The semiconductor device according to claim 13, wherein the optical reflection factor of the position reference portion is smaller than the optical reflection factor of the central area of the second main surface.

* * * * *